United States Patent [19]

Fullwood et al.

[11] Patent Number: 4,472,804

[45] Date of Patent: Sep. 18, 1984

[54] METHOD AND MEANS FOR RELIABILITY AND MAINTAINABILITY ANALYSIS

[75] Inventors: Ralph R. Fullwood, Palo Alto; George B. Rothbart, San Carlos, both of Calif.

[73] Assignee: Electric Power Research Institute, Inc., Palo Alto, Calif.

[21] Appl. No.: 252,583

[22] Filed: Apr. 9, 1981

[51] Int. Cl.³ .................. G06F 11/00; G06F 15/20
[52] U.S. Cl. .................................... 371/23; 364/578
[58] Field of Search ................. 371/23; 364/578, 200

[56] References Cited

U.S. PATENT DOCUMENTS

| | | | |
|---|---|---|---|
| 3,702,011 | 10/1972 | Armstrong | 364/578 |
| 3,715,573 | 2/1973 | Vogelsberg | 371/23 |
| 4,064,394 | 12/1977 | Allen | 364/200 |
| 4,139,895 | 2/1979 | Kurkjian et al. | 364/578 |

OTHER PUBLICATIONS

Rothbart et al., Experiments with Stochastic Systems, 1981 Proceedings, Annual Reliability and Maintainability Symposium, Jan., 1980, pp. 185-191.
Frey, Jr. et al., Digital Pseudorandom Error and Burst Error Generator, IBM Technical Disclosure Bulletin, vol. 11, No. 12, May, 1969, pp. 1718-1719.
Lewis et al., Method for Time-Dependent Failure Rates Analysis, IBM Technical Disclosure Bulletin, vol. 16, No. 5, Oct. 1973, pp. 1686-1688.

Primary Examiner—Charles E. Atkinson
Attorney, Agent, or Firm—Flehr, Hohbach, Test, Albritton & Herbert

[57] ABSTRACT

A failure simulation system utilizing fast failing units whereby system availability and reliability analysis can be completed in highly compressed periods of time. Each fast failing unit includes a random pulse generator and a variable failure rate pulse generator. Coincidence of pulses from the two generators signifies a unit failure. The pulse rate of the variable pulse generator is correlated to the probable time-dependent failure rate of the unit when new, as burned in, as aged, and as repaired. A one shot multivibrator responsive to unit repair resets the unit to an operational state after a determined repair time and adjusts the pulse rate of the variable pulse generator to correlate with a repaired unit. Deterministic and stochastic common mode inputs for each fast failure unit allow other units to either fail or accelerate failure, respectively, of the unit. Since the fast failing units have two logic states, the units can be interconnected by logic means in general configurations to simulate the performance of virtually any large complex system.

13 Claims, 7 Drawing Figures

METHOD AND MEANS FOR RELIABILITY AND MAINTAINABILITY ANALYSIS

This invention relates generally to the analysis of complex systems for reliability and maintainability, and more particularly the invention relates to apparatus for simulating components in complex systems and the method of analysis using such apparatus.

In complex systems such as nuclear power generating plants, for example, considerable redundancy is provided to improve reliability and safety. However, because of the potential danger resulting from system failure, empirical data to substantiate mathematical models is highly desirable. In a system having a failure rate $10^{-2}$ failures per year, approximately 10,000 years of observation would be required to empirically demonstrate this failure rate to an accuracy of 10% with a confidence level of 90%. Consequently, the mathematical models and computer software which have evolved from these models suffer from the lack of rigorous and repeated observations of many events, and are therefore not critically tested with respect to validity or useful limitations.

Accordingly, an object of the invention is apparatus which emulates the reliability and availability of any general complex redundant system.

Another object of the invention is a method of analyzing the performance of such complex redundant systems on a highly compressed timescale.

Still another object of the invention is a failure simulation system with the flexibility for emulating various complex redundant systems.

Yet another object of the invention is a fast failing unit for use in a failure simulation system and which can emulate a component or subsystem thereof.

Briefly, in accordance with the present invention a failure simulation system includes a plurality of fast failing units which simulate the operational state and failed state of components of the simulator system. Each of the fast failing units includes a first electric pulse generator for generating pulses at random, a second electric pulse generator for generating pulses of a time varying rate correlated to the failure rate of a simulated system, and coincidence means responsive to coincidence of pulses from the first electric pulse generator and from the second electric pulse generator for establishing a fail state. Means logically interconnect the fast failing units whereby the operational states and fail states of all fast failing units interconnect logically to simulate the operational and fail states of the simulated system.

Preferably, the second electric pulse generator generates pulses at a first rate indicative of failure rate of a simulated new component, a second rate indicative of failure rate of a simulated new component after an initial time period of successful operation, and a third rate indicative of failure rate of a simulated component after prolonged use and aging. Such a sequence of failure rates is often termed a mortality failure rate or bath tub failure rate curve.

Preferably, at least some of the fast failing units include a third electric pulse generator responsive to a fail state and generating a pulse for resetting the unit to an operational state, the time period between initiation of the fail state and a pulse from the third electric pulse generator being correlated to time for repairing the simulated component. A pulse from the third electric pulse generator resets the pulse rate of the second electric pulse generator to a rate indicative of failure rate after repair of the simulated component.

In a preferred embodiment the first electric pulse generator includes a shift register in which bits are shifted once each a clock period, and the shift register has at least one feedback path between stages whereby shifting of bits in the serial shift register is altered. The feedback path of the electric pulse generator may include logic circuitry for responding to bits in the shift register and altering a bit in at least one stage of the shift register.

The invention and objects and features thereof will be more readily apparent from the following detailed description and appended claims when taken with the drawing, in which:

Figure 1A:
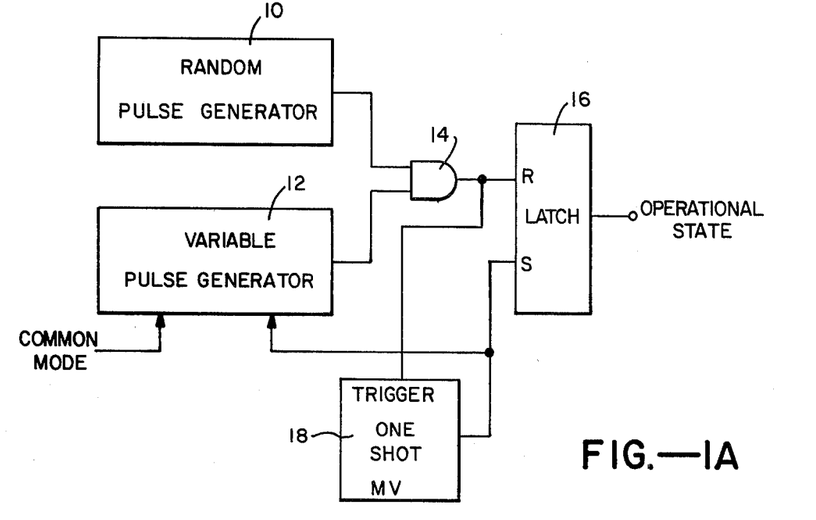
FIG. 1A is a schematic of a fast failing unit in accordance with the present invention.
Figure 1B:
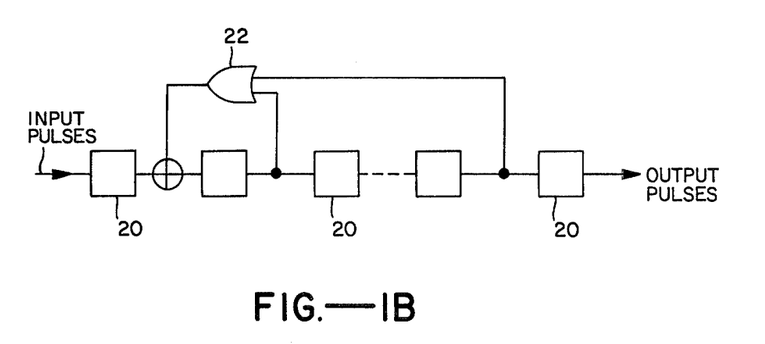
FIG. 1B is a schematic of a random pulse generator useful in the circuit of FIG. 1A.

FIG. 1 is a schematic of a fast failing unit in accordance with one embodiment of the present invention. The unit comprises a random pulse generator 10 and a variable pulse generator 12 with the outputs of the two pulse generators being applied as inputs to an AND gate 14. Preferably, the random pulse generator includes an N bit serial shift register with bits being shifted once per clock period. As illustrated in FIG. 1A, selective ones of the N stages 20 are interconnected to logic means such as OR gate 22 with the output of the OR gate summed with the input of another stage. Such circuitry is further illustrated in U.S. Pat. No. 3,911,216. By logically combining certain bits in the shift register and providing the combined bits as feedback to the shift register, the output bit stream can have a purely binomial distribution with each bit having a probability of 0.5 of being a one or a zero and being independent of the state of any other bit. The sequence of N bits so generated repeat after $2^N$ shifts; and for N=40 and a time period of 0.1 microseconds, recycling occurs after $10^5$ seconds.

The variable pulse generator 12 generates pulses at a rate indicative of probable failure of a component, as will be described further hereinbelow with reference to FIG. 2. The failure rate may be stored in a preprogrammed read-only memory (PROM), allowing for any given time-dependent failure rate curve, and the PROM is uniformly and sequentially swept using a binary counter. The counters can be driven by a variable oscillator with the pulse train from the oscillator determined by a divider selected by the common-mode condition of the fast failing unit or by a repair reset signal. By sequencing the PROM at a faster rate the result is accelerated failure.

The coincidence of pulses from generator 10 and generator 12, as determined by AND gate 14, represents a unit failure. Common-mode inputs may be input to the variable pulse generator from other fast failure component outputs that may accelerate the failure of this component, as will be described further hereinbelow with reference to FIG. 5.

The output of AND gate 14 is applied to the reset terminal of a latch 16. The output of latch 16 is initially set as a "1" or positive voltage, and the signal from AND gate 14 to the reset terminal resets the output of the latch to a "0" or low voltage state indicative of unit failure.

The output of AND gate 14 is also applied to trigger a monostable multivibrator 18 with the triggering of the multivibrator 18 being dependent on suitable timing circuitry used to simulate the time to repair the component. The output of the multivibrator 18, indicative of the repair of the failed unit, is applied to the set terminal of latch 16 to again set the output of latch 16 to a plus voltage level indicative of unit operability. The output of multivibrator 18 is also applied as feedback to pulse generator 12 and resets the pulse rate of the generator to a rate indicative of failure rate of the repair.

Figure 2:
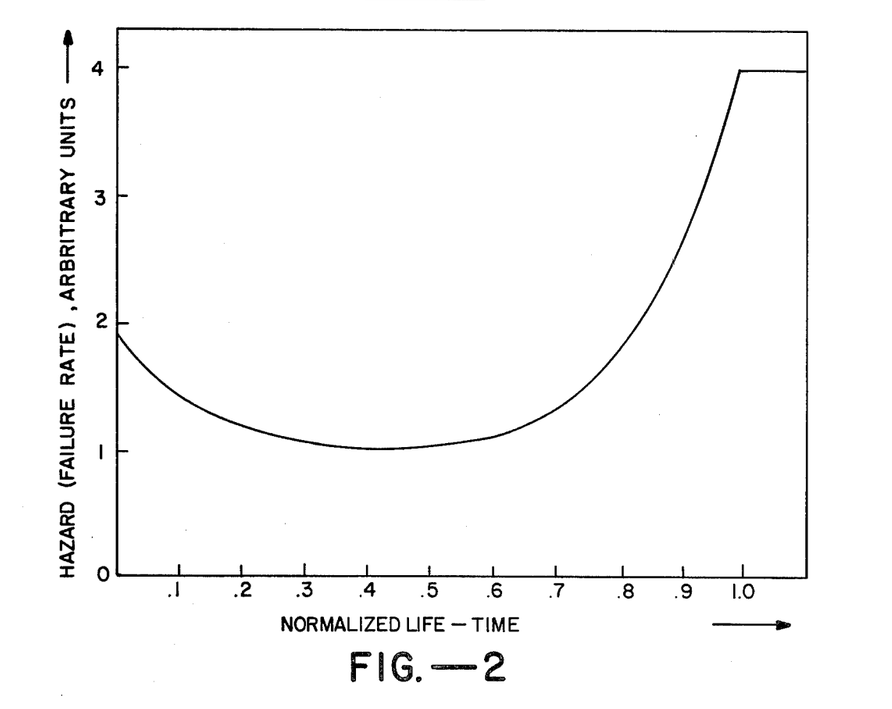
FIG. 2 is a plot of an example of time dependent failure rate curve for the unit of FIG. 1A.

FIG. 2 is a curve illustrating a specific example of the variable time dependent pulse rate or bathtub failure rate of generator 12 with the units of the axes being arbitrary. At time T=0 this failure rate has an arbitrary value of 2 and with increasing time the failure rate decreases in an exponential manner to a value of 1. After a period of relatively constant pulse rate of 1 the failure rate begins rising in an exponential manner and eventually reaches a steady level of 4. The initial failure rate is indicative of the probability of failure of a new component, and the decreasing failure rate is indicative of the reduced failure rate as the unit is burned in. The failure begins rising again as the unit ages, and reaches the maximum failure rate as the unit approaches its rated full life. Thus, the probability of a pulse from pulse generator 12 coinciding with a random pulse from generator 12 decreases as a unit is burned in and increases as the unit ages. FIG. 2 illustrates the concept of the variable pulse generator with the curve shown. The invention, however, allows any shape of failure rate vs. time to be programmed into each fast failing unit through the use of programmable read-only memory devices (PROMS).

Figure 3:
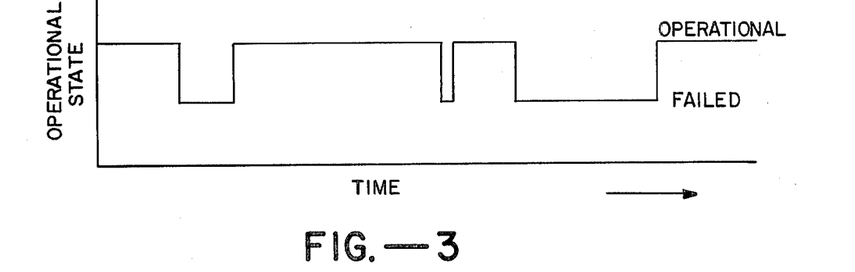
FIG. 3 is a plot of operational state versus time of the unit of FIG. 1.

FIG. 3 is a plot showing the operational state of a unit of FIG. 1. When the latch 16 is at a high voltage state (e.g. 2.3 volts) the unit is operational. Upon a coincidence of the pulses from generators 10 and 12 the voltage drops below 0.8 volts and is indicative of a failed state. Upon the setting of latch 16 in response to the multivibrator 18 the voltage again rises to 2.3 volts indicating that the unit is again operational. The length of the fail state is dependent on the repair time for the unit as indicated by the time period between AND gate 14 going positive and the actual generation of a pulse by multivibrator 18 as applied to the set input of latch 16.

The following table shows the electronic equivalents of the components:

| Term | Reliability Theory | Digital Electronics |
| --- | --- | --- |
| Component is Operational | Working Available (state) Success State Up | 1 bit HI bit +2.3 volts |
| Component is Not Operational | Failed Unavailable Down | 0 bit LO bit +0.8 volts |
| Failure | Transition from | Sudden Voltage |

-continued

| Term | Reliability Theory | Digital Electronics |
| --- | --- | --- |
| Repair | Working to failed states Transition from Failed to working states | drop from Hi to LO Sudden voltage rise from LO to HI |

Figure 4:
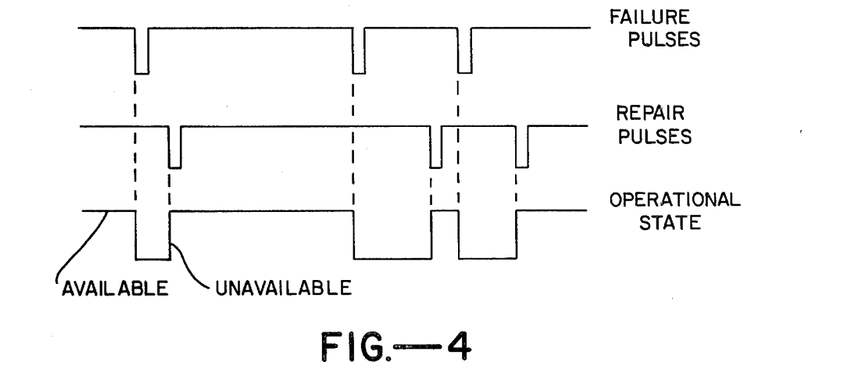
FIG. 4 is a plot illustrating the electronic state of the unit of FIG. 1.

FIG. 4 further illustrates the failure pulses from the AND gate 14, the repair pulses from the one shot multivibrator 18, and the resultant operational state of the unit. The failure pulses reset latch 16 and drive the output of the latch to a low voltage level indicative of the fail state, the repair pulses from the one shot multivibrator 18 again set the latch 16 and raise the output to the positive operational state, all as illustrated in FIG. 4.

Illustration of the operation of each fast failing unit in one of two states allows the units to be recorded mathematically as "logic elements" and therefore electronically represented by binary digits. When a unit makes a transition from one state to the other, the transition is considered to take place instantaneously and marks the moment of failure or repair. The equivalent electronic representation is a bit flip or merely a square wave swing in the binary voltage as illustrated in the table above. The time at which a failure or repair occurs is a continuous variable and because the moment of failure is not known beforehand and also the repair time cannot be predicted, these events have a characteristic of being random or "stochastic".

Another important failure mode which is provided in the fast failing units is that of common mode. Two types of common mode interactions have been identified from actual experience, deterministic and stochastic. The deterministic mode describes the case when the failure of one component immediately causes the failure of a second component. The stochastic mode is used to model the degradation but not immediate failure of a component caused by the failure of another. Thus, the failure rate (or pulse rate) of the second component can be increased by a predetermined factor in response to the failure of another unit. Further, once the failing component has been repaired, the original failure rate can be restored for the second unit.

Figure 5:
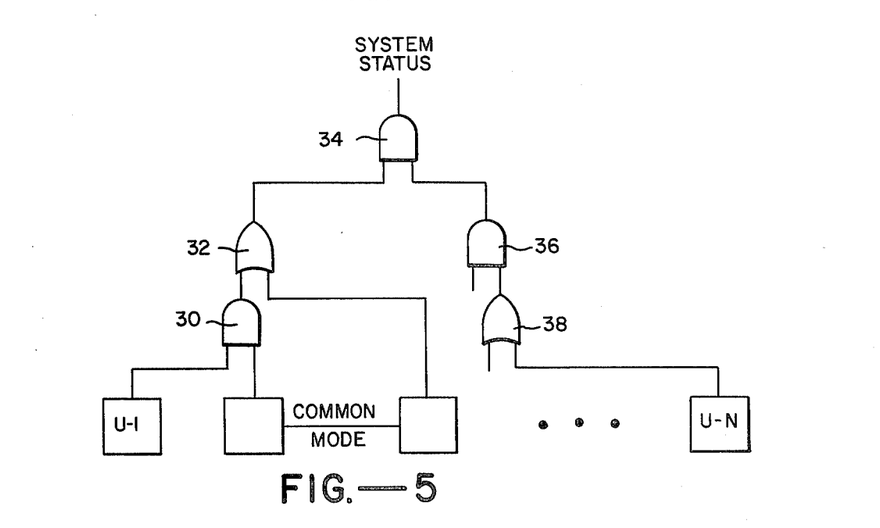
FIG. 5 is a diagram of a system employing a plurality of fast failure units shown in FIG. 1.
Figure 6A:
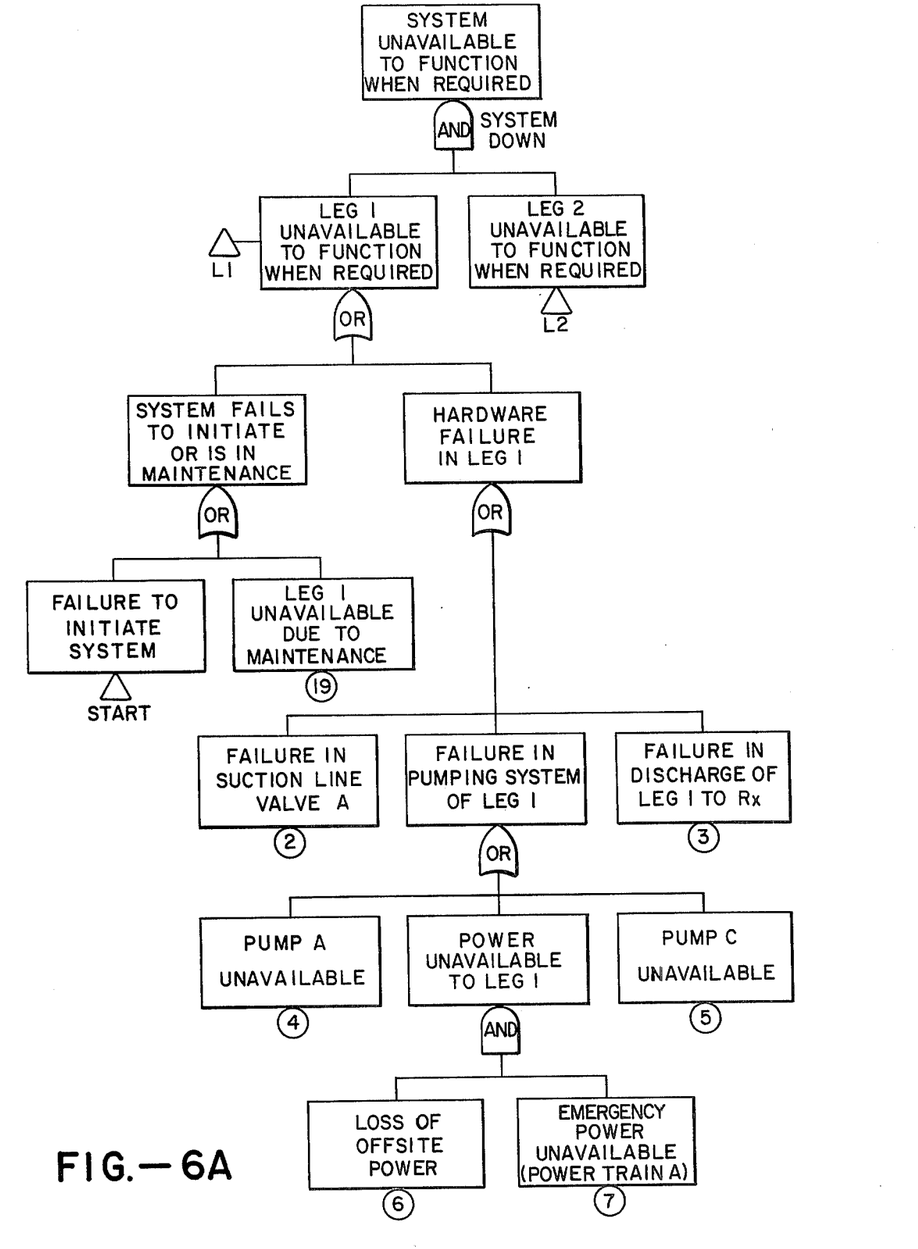
FIG. 6 is a fault tree simulating an eighteen component low pressure coolant injection system.
Figure 6B:
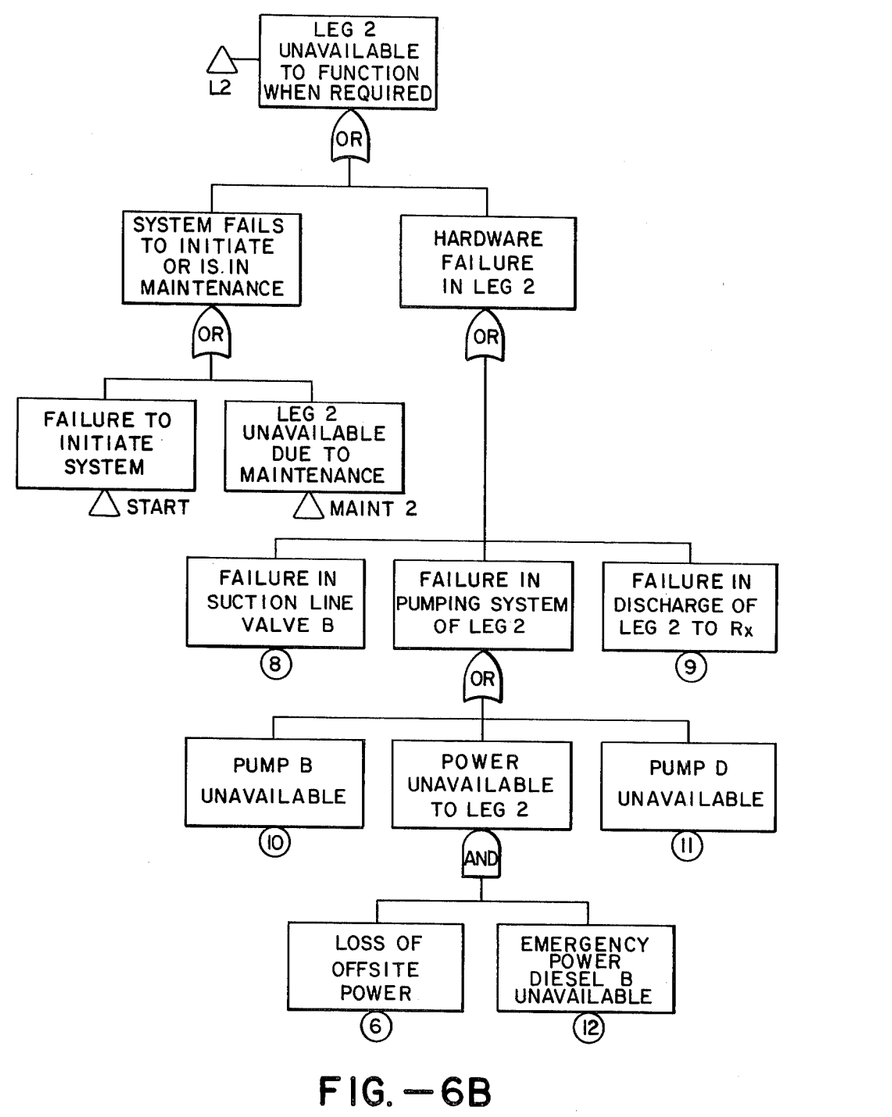
Figure 6C:
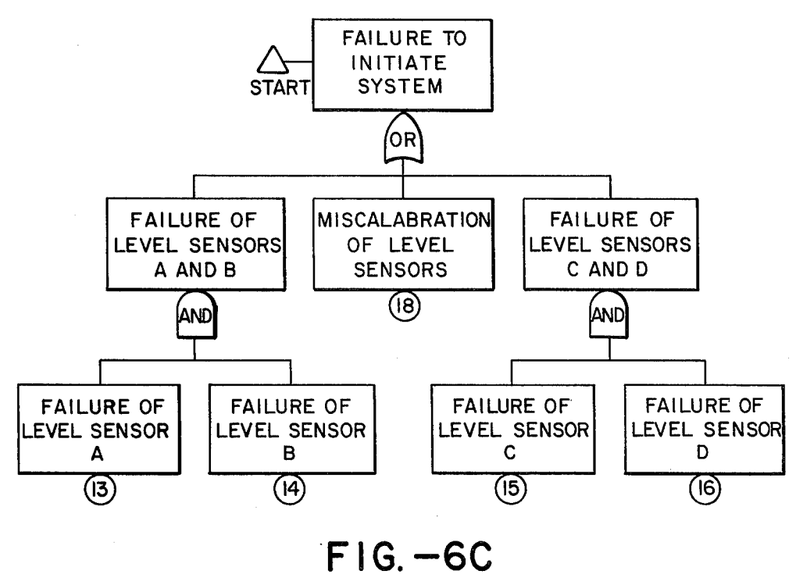
Figure 6D:
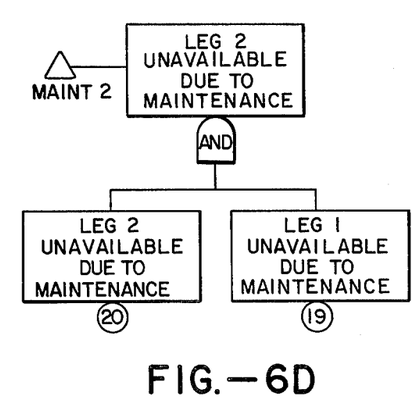

FIG. 5 is a block diagram of a system utilizing a plurality of fast failing units such as illustrated in FIG. 1. The plurality of units U-1 . . . U-N are interconnected by logic elements such as AND gate 30, OR gate 32, AND gate 34, AND gate 36, and OR gate 30 so that the system status is determined by a logical combination of the states of the plurality of fast failing units.

Repair times for all fast failing units of the system can be established through a combination of modes including fixed time, fixed time plus a random or exponentially distributed time, or scheduled repairs that are synchronous with a clock. Repairs reset the failure rate or pulse rate of the variable pulse generator 12 so that a repair can be equivalent to a part replacement.

Fault simulation systems in accordance with the present invention have been successfully employed to simulate the failures of a complex system which would normally occur over a period of thousands of years to a time period measured in minutes. Time compression factors of 10 billion to one, where 40 years real time is simulated in one-eighth of a second have been demonstrated. FIG. 6 is one such system in which eighteen fast failing units were configured to model a low pressure coolant injection system for simulating a boiling water reactor (BWR) emergency core cooling system in a nuclear reactor. The eighteen units represented mechanical elements such as motor operated valves, pumps, emergency powered diesel generators, and level sensors, along with maintenance elements and offsite power. The components were assigned typical failure and repair values and arranged in a redundant manner characteristic of an actual system. The results from using the failure simulation system were compared with predictions based on independent computer code simulations. The results using the simulated failure system were in very good agreement with the results based on the computer code simulations.

The following table identifies the components of FIG. 6:

TABLE

| Component Type | FCC Logical No. | MTTF (Yrs.) | MTTR (Weeks) | Unavailability |
| --- | --- | --- | --- | --- |
| Suction Motor-Operated Valve (A) | 2 | 82 | 8.05 | $1.884 \times 10^{-3}$ |
| Discharge Motor-Operated Valve (A) | 3 | 28 | 8.05 | $5.498 \times 10^{-3}$ |
| Pump (A) | 4 | 40 | 8.05 | $3.855 \times 10^{-3}$ |
| Pump (C) | 5 | 40 | 8.05 | $3.855 \times 10^{-3}$ |
| Off-Site Power | 6 | 10 | 2.05 | $3.927 \times 10^{-3}$ |
| Emergency Power Diesel (A) | 7 | 2 | 8.05 | $7.184 \times 10^{-2}$ |
| Suction Motor-Operated Valve (B) | 8 | 82 | 8.05 | $1.884 \times 10^{-3}$ |
| Discharge Motor-Operated Valve | 9 | 28 | 8.05 | $5.498 \times 10^{-3}$ |
| Pump (B) | 10 | 40 | 8.05 | $3.855 \times 10^{-3}$ |
| Pump (D) | 11 | 40 | 8.05 | $3.855 \times 10^{-3}$ |
| Emergency Power Diesel (B) | 12 | 2 | 8.05 | $7.184 \times 10^{-2}$ |
| Level Sensor (A) | 13 | 30 | 8.05 | $5.134 \times 10^{-3}$ |
| Level Sensor (B) | 14 | 30 | 8.05 | $5.134 \times 10^{-3}$ |
| Level Sensor (C) | 15 | 30 | 8.05 | $5.134 \times 10^{-3}$ |
| Level Sensor (D) | 16 | 30 | 8.05 | $5.134 \times 10^{-3}$ |
| Level Sensor Calibration | 18 | 512 | 2.05 | $7.699 \times 10^{-5}$ |
| Maintenance leg 1 | 19 | 2 | 2.05 | $1.933 \times 10^{-2}$ |
| Maintenance leg 2 | 20 | 2 | 2.05 | $1.933 \times 10^{-2}$ |

The logical connection of these components in standard fault tree notation is shown in FIG. 6. It will be noted that in several instances the same component is present in several branches of the tree.

The flexibility of the failure analysis system in accordance with the present invention and the correlation of the system with computer code simulations has demonstrated the accuracy and utility of the failure analysis tool. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. For use in a failure simulation system, a fast failing unit having an operational state and a fail state comprising a first electric pulse generator for randomly generating pulses, a second electric pulse generator for generating pulses at a time varying rate correlated to a failure rate of a simulated component, and coincidence means responsive to coincidence of pulses from said first electric pulse generator and from said second electric pulse generator for establishing a failed state.

2. A fast failing unit as defined by claim 1 and further including reset means including a third electric pulse generator interconnected with said coincidence means and responsive to a fail state and generating a pulse for resetting said coincidence means to an operational state, the time period between initiation of a fail state and a pulse from said third electric pulse generator being correlated to time for repairing said simulated component.

3. A fast failing unit as defined by claim 1 or 2 wherein said first electric pulse generator comprises a serial shift register in which bits are shifted once per a clock period, T, said shift register having at least one feedback path between stages whereby a shifting of bits in said serial shift register is altered.

4. A fast failing unit as defined by claim 3 wherein said at least one feedback path comprises logic circuitry for responding to bits in said serial shift register and altering a bit in at least one stage of said shift register.

5. A fast failing unit as defined by claims 1 or 2 wherein said second electric pulse generator generates pulses at a first rate indicative of failure rate of a simulated new component, a second rate indicative of failure rate of a simulated new component after an initial time period of successful operation, and a third rate indicative of failure rate of a simulated component after prolonged use and aging.

6. A fast failing unit as defined by claim 5 wherein a pulse from said third electric pulse generator resets the pulse rate of said second pulse generator to a rate indicative of failure rate of a simulated component after repair.

7. A failure simulation system comprising a plurality of fast failing units which simulate the operational state and failed state of components of the simulator system,
   each of said fast failing units having a first electric pulse generator for generating pulses at random, a second electric pulse generator for generating pulses of a time varying rate correlated to a failure rate of a simulator component, and coincidence means responsive to coincidence of pulses from said first electric pulse generator and from said second electric pulse generator for establishing a fail state, and
   means for logically interconnecting said coincidence means of said fast failing units whereby the operational states and failed states of all fast failing units interact logically to simulate the operational and failed states of the said simulated system.

8. A failure simulation system as defined by claim 7 wherein at least some of said fast failing units include reset means including a third electric pulse generator interconnected with the coincidence means and responsive to a fail state and generating a pulse for resetting said coincidence means to an operational state, the time period between initiation of a fail state and a pulse from said third electric pulse generator being correlated to time for repairing said simulated component.

9. A failure simulation system as defined by claim 8 wherein said second electric pulse generator generates pulses at a first rate indicative of failure rate of a simulated new component, a second rate indicative of failure rate of a simulated new component after an initial time period of successful operation, and a third rate indicative of failure rate of a simulated component after prolonged use and aging, a pulse from said third electric pulse generator resetting the pulse rate of said second electric pulse generator to a rate indicative of failure rate after repair of the simulated component.

10. A failure simulation system as defined by claim 9 wherein said first electric pulse generator comprises a shift register in which bits are shifted once per a clock period, T, said serial shift register having at least one feedback path between stages whereby shifting of bits in said serial shift register is altered.

11. A failure simulation system as defined by claim 10 wherein said at least one feedback path in said electric pulse generator comprises logic circuitry for responding to bits in said shift register and altering a bit in at least one stage of shift register.

12. A failure simulation system as defined by claim 7 wherein said means for logically interconnecting said fast failing units includes common mode interconnections between at least two units whereby the failed state of one unit accelerates failure of the other unit.

13. A fast failing unit as defined by claim 2 wherein said coincidence means further includes latch means having a set input and a reset input, and means for connecting pulses from said third electric pulse generator to an input of said latch means.

* * * * *